United States Patent [19]

Toyohara

[11] Patent Number: 5,572,610
[45] Date of Patent: Nov. 5, 1996

[54] WAVEGUIDE-TYPE OPTICAL DEVICE AND IMPEDANCE MATCHING METHOD THEREOF

[75] Inventor: Atsushi Toyohara, Tokyo, Japan

[73] Assignee: NEC Corporation, Japan

[21] Appl. No.: 259,056

[22] Filed: Jun. 13, 1994

[30] Foreign Application Priority Data

Jun. 15, 1993 [JP] Japan ................................. 5-143560

[51] Int. Cl.$^6$ ................................................. G02B 6/12
[52] U.S. Cl. ........................... 385/14; 385/2; 385/8
[58] Field of Search .................... 385/1–4, 8, 9, 385/14; 359/180, 181, 187–191, 195; 333/213–217

[56] References Cited

U.S. PATENT DOCUMENTS

| | | | |
|---|---|---|---|
| 4,147,997 | 4/1979 | Greaves | 333/214 |
| 5,010,588 | 4/1991 | Gimlett | 359/189 |
| 5,097,219 | 3/1992 | Itoh | 331/17 X |
| 5,138,480 | 8/1992 | Dolfi et al. | 385/2 X |
| 5,208,697 | 5/1993 | Schaffner et al. | 385/3 X |

FOREIGN PATENT DOCUMENTS

A05055013  3/1993  Japan.
A05258924  10/1993  Japan.

OTHER PUBLICATIONS

IEEE Photonics Technology Letters, May 1989, USA, vol. 1, No. 5, ISSN 1041-1135, pp. 102–104, XP 000034300, Johnson.

Journal of Lightwave Technology, Dec. 1989, USA, vol. 7, No. 12, ISSN 0733-8724, pp. 2078–2083, XP 000103644, Betts et al.

RF Design, vol. 15, No. 22, Feb. 1992 US, p. 77, Breed.

Patent Abstracts of Japan, vol. 017 No. 353 (E–1393), 5 Jul. 1993.

Patent Abstracts of Japan, vol. 018, No. 020 (E–1489), 13 Jan. 1994.

Electronics & Communications in Japan, Part II—Electronics, vol. 76, No. 1, Jan. 1993 New York US, pp. 25–33, XP 000395402, Kitoh et al.

Primary Examiner—John D. Lee
Attorney, Agent, or Firm—Laff, Whitesel, Conte & Saret, Ltd.

[57] ABSTRACT

The present application relates to a waveguide-type optical device comprising an impedance matching means for matching impedance of a side of a control signal source supplying a control signal to control propagation of light waves in an optical waveguide of the waveguide-type optical device and impedance of a side of a signal electrode receiving the control signal, wherein this impedance matching means is provided between the side of the control signal source and the side of the signal electrode. A waveguide-type optical device of the present invention overcomes characteristic deterioration caused by un-matching of impedance. Additionally, the present invention can extend the degree of freedom for designing a waveguide-type optical device.

9 Claims, 7 Drawing Sheets

WAVEGUIDE-TYPE OPTICAL DEVICE AND IMPEDANCE MATCHING METHOD THEREOF

BACKGROUND OF THE INVENTION

The present invention relates to a waveguide-type optical device, for example, a waveguide-type optical device for light modulating or light switching using optic effects.

For a light modulator or a light switch, wide band, very high speed and low power operation is required. Accordingly, in theory, an electro-optic effect of which operation speed is high is used in many cases.

This electro-optic effect is a phenomenon that refractive index of a material changes when the material is charged by electric field. This effect is used for developing various kinds of waveguide-type optical devices.

FIG. 10 and FIG. 11 are figures showing configuration of a Mach-Zehnder light modulator as an example of a waveguide-type device using such electro-optic effects.

FIG. 10 is a plan view of the Mach-Zehnder light modulator and FIG. 11 is a cross section view taken on line II–II' of FIG. 10.

First, the configuration and operation of this light modulator are explained, referring to these pictures.

The Mach-Zehnder light modulator comprises the base 101 having an electro-optic effect, the light waveguide 102 formed on this base 101, the buffer layer 103 formed on the base 101 and the signal electrode 104 formed on this buffer layer 103.

Various kinds of material can be used for each component. For the base 101, for example, lithium niobate ($LiNbO_3$) is used frequently. In this case, the light waveguide 102 is formed by thermally diffusing titanium into the $LiNbO_3$ forming the base.

Moreover, a film made of silicon dioxide ($SiO_2$) is used frequently for the buffer layer 103, also gold (Au) is used frequently for the signal electrode 104. The signal source for modulation 105 is connected with the signal electrode 104.

Next the operation of this light modulator is explained.

When the light from a semiconductor laser entries into light waveguide 102 from the light incident terminal 106, the incident laser light is divided into the light waveguides $102_1$ and $102_2$ at the light divergence section 107.

Here, if charging modulation voltage on the light waveguide $102_1$ using the signal source for modulation 105, a phase difference between the light propagating in the light waveguide $102_1$ and the light propagating in the light waveguide $102_2$ is caused by an electro-optic effect.

When these lights join at the light junction section 108, an interference corresponding to the phase difference arises. As the result, strength modulation corresponding to the modulation voltage is added to the light radiated from the light outgoing terminal 109.

For example, if charging modulation voltage to two lights alternately so as to make the phase difference between them become 0 and $\pi$, the light signal of which light strength alternately changes from maximum value and to minimum value is obtained at the light outgoing terminal 109.

In many cases, a traveling-wave-type electrode is used for such a light modulator to realize band widening or very high speed. In other words, this is a configuration that the micro wave modulation voltage is entered from an end of the signal electrode 104 that is a side of light entry and another end of the signal electrode is terminated using impedance of a signal line.

For designing such a large traveling wave electrode, it is necessary to arrange so as to obtain a large light modulation band $\Delta f$ and enable to modulate the light with a small driving voltage $V\pi$.

Among them, the light modulation band $\Delta f$ is dependent on the length 1 of signal electrode and the transmission refractive index $n_m$ of the micro wave. When a loss of the micro wave propagating in the traveling wave electrode is ignored, the relation among them is shown by the following equation.

$$\Delta f = 1.9\ C_0/(F(\pi l |n_m - n|))$$

Where, $C_0$ is a velocity of light in vacuum, n is a refractive index of a light waveguide.

As shown by the equation, the light modulation band $\Delta f$ (upper limit of a high speed modulation frequency) is limited by a difference between $n_m$ and n, that is, the closer $|n_m - n|$ comes to '0', the larger light modulation band $\Delta f$.

By this reason, as described in the paper titled "Optimization of Ti:$LiNbO_3$ modulator electrodes using finited element method" of the technical report of the Optical Quantum Electronics Department of the Institute of Electronics and Communication Engineers, No. 66, vol. 88 on May 30, 1988, the following parameters are determined when designing a signal electrode so as to make the transmission refractive index $n_m$ come close to the refractive index n of the light waveguide, based on the dielectric constant of the base used at computer simulation.

(1) Basic structure of a signal electrode
(2) Width W of signal electrode
(3) Interval G between signal electrodes
(4) Thickness t of a signal electrode FIG. 12 shows a simulation result of a transmission refractive index $n_m$ that is obtained in the conditions that the basic structure of the signal electrode is a CPW (co-planar waveguide) structure, lithium niobate is used for the base material and the width W of signal electrode is 5 μm. This figure shows a relation between the interval G of signal electrodes and the transmission refractive index $n_m$ when the thickness t of the signal electrode is a parameter.

The refractive index n of a light waveguide made by doping titanium on a base of lithium niobate is approximately 2.2. Accordingly, it is expected that the transmission refractive index $n_m$ of micro wave is also near by this value. As clearly known in the figure, there are many possible combinations of the interval G between signal electrodes and the thickness t of the signal electrode that makes the transmission refractive index $n_m$ be 2.2, that is, one of the two factors must be set firstly to determine the value of another factor.

The interval G between signal electrodes relates to the driving voltage $V\pi$, the narrower the interval G between signal electrodes, the smaller the driving voltage $V\pi$.

Also, from the view point of characteristics of a light modulator such as quenching ration, the narrower interval G between signal electrodes is better. In many cases, the value is set less than 15 μm. By the reason, if the interval G between signal electrodes is set to 15 μm, the thickness t of signal electrode is determined as 2 μm by relation shown in FIG. 12.

As mentioned above, if each parameter of the signal electrode is determined the characteristic impedance Z of the signal electrode is decided from the characteristics such as the light modulation band $\Delta f$ of a light device.

FIG. 13 shows a relation between the characteristic impedance Z and the interval G between signal electrodes.

FIG. 13 shows that if letting the interval G between signal electrodes be 15 μm and the thickness t of the signal electrode be 12 μm, the characteristic impedance Z becomes 46 Ω.

In other words, if driving this device using the signal source for modulation of which characteristic impedance is 46 Ω, a desired characteristic can be obtained.

The characteristic impedance of a signal source for modulation is, however, 50 Ω usually.

As it is difficult to design as the impedance and the transmission refractive index $n_m$ are set to desired values, the characteristic refractive index $n_m$ is firstly matched to the refractive index of a light waveguide in the conventional design stage for a waveguide-type optical device.

In addition, the impedance of the signal electrode of the obtained optical device is different from the impedance of the signal source for modulation. As the result, the conventional waveguide-type optical device has been used in a state that the characteristic impedance of the signal electrode and the characteristic impedance of the signal source for modulation does not coincided each other.

As shown in the Japanese Patent Publication No. 4-76456 (1992), there is a method to adjust the characteristic impedance Z of the signal electrode by adjusting thickness of a buffer layer. In this case too, however, there is a difficulty to design so that the impedance and the transmission refractive index $n_m$ are set to desired values as described before.

Described as above, a prior art has problems such as the device can not work fully because un-matching of impedance causes deterioration of modulation band or power reflection at the phase of signal input.

SUMMARY OF THE INVENTION

An object of the present invention is to offer a waveguide-type optical device preventing characteristic deterioration caused by un-matching of impedance if using a signal electrode designed by aiming at only transmission refractive index.

The object of the present invention is achieved by a waveguide-type optical device comprising an impedance matching means for matching impedance of a side of a control signal source supplying a control signal to control propagation of light waves in an optical waveguide of said waveguide-type optical device and impedance of a side of a signal electrode receiving said control signal, wherein said impedance matching means is provided between said side of the control signal source and said side of the signal electrode.

It is to be noted that it is preferable that said impedance matching means is an impedance conversion circuit comprising resistors connected in T network or π network.

Moreover, it is possible that said impedance matching means can be formed on a base of said waveguide-type optical device, at this time it is preferable that the impedance matching means is an impedance conversion circuit comprising a pattern wiring of resistors.

Moreover, it is preferable that the type of said pattern wiring is T network or π network.

Moreover, it is possible that said signal electrode can be of a co-planar waveguide structure.

Moreover, it is preferable that said waveguide-type optical device comprises: a base; an optical waveguide formed on said base; a buffer layer formed on said base; and a signal electrode formed on said buffer layer.

Moreover, said waveguide-type optical device can be applied to an optical modulator.

Furthermore, the object of the present invention is achieved by a waveguide-type optical device comprising:
a base;
an optical waveguide formed on said base;
a buffer layer formed on said base;
a signal electrode formed on said buffer layer;
a connector of supplying a control signal controlling light waves propagating in said optical waveguide to said signal electrode; and
an impedance matching means for matching impedance of said connector and that of said signal electrode.

It is to be noted that it is preferable that said signal electrode is of a co-planar waveguide structure.

Moreover, it is preferable that said impedance matching means is an impedance conversion circuit comprising resistors connected in T network or π network.

Furthermore, the object of the present invention is achieved by a waveguide-type optical device comprising:
a base;
an optical waveguide formed on said base;
a buffer layer formed on said base;
a signal electrode formed on said buffer layer;
a connector for supplying a control signal controlling light waves propagating in said optical waveguide to said signal electrode; and
an impedance matching means formed on said base for matching impedance of said connector and that of said signal electrode.

Moreover, it is preferable that said signal electrode is of a co-planar waveguide structure.

Moreover, it is preferable that said impedance matching means is an impedance conversion circuit formed by configuring resistor patterns in T network or π network on said base.

Furthermore, the object of the present invention is achieved by an impedance matching method of a waveguide-type optical device comprising:
an impedance matching means provided between a side of a control signal source supplying a control signal to control propagation of light waves in an optical waveguide of said waveguide-type optical device and a side of a signal electrode being supplied said control signal, wherein said impedance matching means matches impedance of said side of the control signal source and that of said side of the signal electrode.

Additionally, the present invention enables to reduce troubles such as deterioration of modulation band or occurrence of power reflection at signal entry.

Accordingly, it makes easy to design a signal electrode because it becomes possible to design the signal electrode by aiming at only transmission refractive index.

In addition, the present invention enables to miniaturize a waveguide-type optical device by providing an impedance matching means on a base on which an optical waveguide is formed.

DETAILED DESCRIPTION OF THE INVENTION

The first embodiment is explained.

Figure 1:
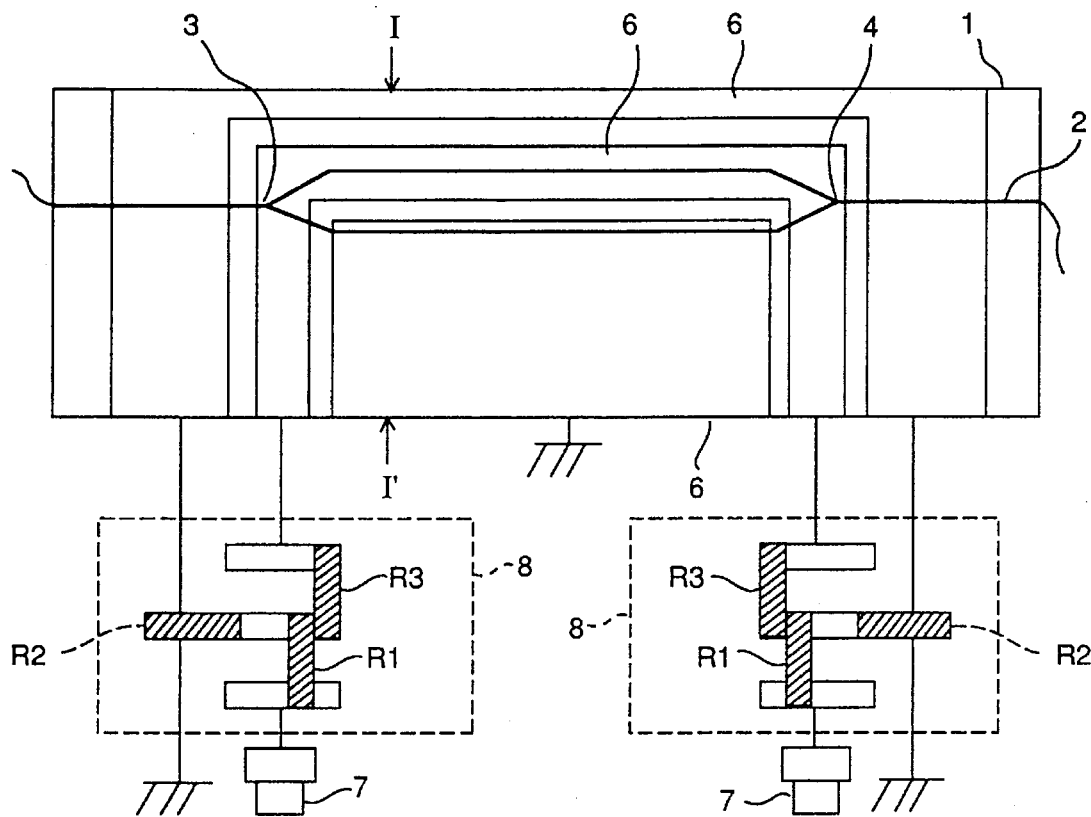
FIG. 1 is an illustration showing a configuration of a waveguide-type device provided with a T network impedance conversion circuit by the present invention.
Figure 2:
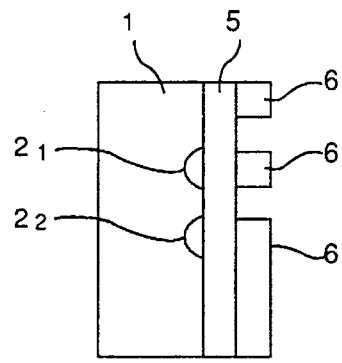
FIG. 2 is a cross section view taken on line I—I' of FIG. 1.

FIG. 1 is a plan view of the waveguide-type optical device in the first embodiment and FIG. 2 is a cross section of the line I—I' in FIG. 1.

A Mach-Zehnder light modulator is used in the first embodiment as an example of the waveguide-type optical device.

First, how to produce a Mach-Zehnder light modulator is explained.

Lithium niobate is used here for the base 1. And a Ti film of which thickness is approximately 100 nm is formed on the base 1 by sputtering.

Next, Ti is kept on a part equivalent to the light waveguide 2 by photolitho method. Then, heat processing for approximately 5 hours is carried out in an atmosphere of approximately 1050° C. to diffuse Ti into the base 1, thus the light waveguide 2 is formed. It is to be noted that the width of the light waveguide 2 is 5 μm, the interval between the light divergence section 3 and the light junction section 4 is 50 mm and the interval between the light waveguides after diverged is 15 μm, here.

After having formed the light waveguide 2, the buffer layer 5 is formed in thickness of approximately 1 μm. Next, Cr film of approximately 20 nm and Au film of approximately 150 nm as substrate electrodes (not shown in figures) are formed on the buffer layer 5.

Then, a resist pattern is formed for obtaining a desired pattern of signal electrode and the signal electrode 6 is formed by gilding. For gilding work a non-cyan liquid is used and plating is performed for approximately 70 minutes in the conditions that liquid temperature is 65° C. and current density is 4mA/cm². By these conditions, an electrode of which thickness is approximately 13 μm is obtained.

After completion of gilding, a Mach-Zehnder light modulator can be obtained by separating useless resists with a solvent and removing a substrate electrode locating at the part where a signal electrode is not formed by dry-etching.

The characteristic impedance Z and transmission refractive index $n_m$ of the Mach-Zehnder light modulator prepared by the above procedure are 44Ω, 2.15, respectively.

For this Mach-Zehnder light modulator, an SMA connector of which impedance is 50Ω is used as the connector 7.

Next, the impedance conversion circuit 8 for matching the characteristic impedance of the signal electrode 6 and the impedance of connector 7 is explained.

There can be a T network conversion circuit or a π network conversion circuit for the impedance conversion circuit 8, the T network conversion circuit using resistors is explained first.

Figure 3:
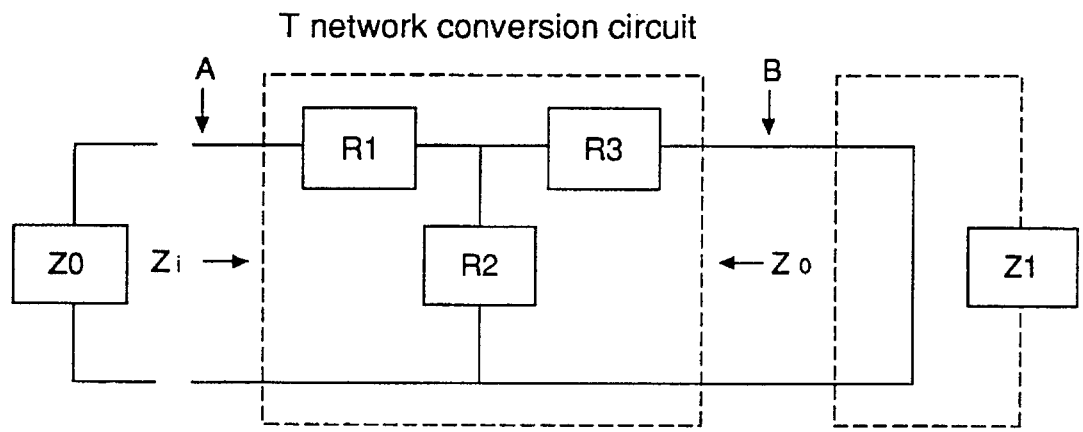
FIG. 3 is an illustration for explaining the T network impedance conversion circuit by the present invention.
Figure 4:
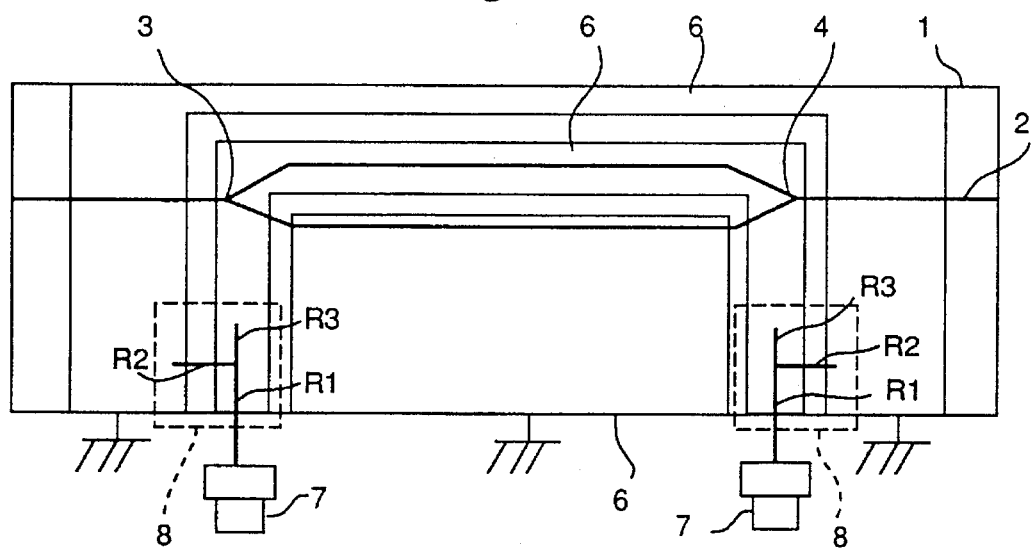
FIG. 4 is an illustration showing a configuration of a waveguide-type device provided with a T network impedance conversion circuit by the present invention.

FIG. 3 is an illustration for explaining a T network conversion circuit.

Where, R1, R2, R3 are resistors, Z0 is the impedance of the connector 7, Z1 is the characteristic impedance of the signal electrode 6, Zi is the impedance of right side of A and Zo is the impedance of left side of B.

In the T network conversion circuit shown in FIG. 3, the impedance matching condition that matches the characteristic impedance of the signal electrode 6 with the impedance of the connector 7 is Z0=Zi and Zo=Z1.

Therefore, the following equations are met.

$$Z0 = Zi = R1 + R2*(R3+Z1)/(R2+R3+Z1) \quad (1)$$

$$Z1 = Zo = R3 + R2*(R1+Z0)/(R1+R2+Z0) \quad (2)$$

Next, the values of resistors R1, R2 and R3 are considered.

Where, Z0=50Ω, Z1=44Ω, R1<50Ω and R3<44Ω from the equations (1) and (2).

If the resistance value of the resistor R1 is large the charge signal to the modulator becomes small, because the power consumption at the resistor R1 becomes large.

Therefore, the smaller resistance value of R1, the better. Using this feature, by substituting an arbitrary resistance value the resistor R1 in turn from small to large the resistance values R2 and R3 are calculated.

The allowance for determination of the values is set in ±1Ω for Zi to Z0 and Zo to Z1, respectively.

Then,
Resistance value of R1=20Ω
Resistance value of R2=68Ω
Resistance value of R3=10Ω.
Under this condition,
Zi=50.0Ω to Z0=50Ω
Zo=44.4Ω to Z1=44Ω.
Thus, matching is realized.

As shown in FIG. 1, the impedance conversion circuit 8 is produced by soldering the chip resistors thus calculated on the electrode pad.

Moreover, it is possible to produce it by realizing the above-calculated resistance value using electrode pattern.

At this time, if considering an electrode of which Cr is 200 Å, Pt is 200 Å, Au is 2000 Å and the width of electrode is 12 μm, the resistance value per unit length is approximately 20Ω/mm and the values of resistors R1, R2 and R3 are as follows.

TABLE 1

| | Width of electrode | Length of electrode |
|---|---|---|
| Resistor R1 | 12.0 μm | 1.00 mm |
| Resistor R2 | 10.6 μm | 3.00 mm |
| Resistor R3 | 12.0 μm | 0.50 mm |

Using these conditions, it is possible to produce the smaller device.

Next, the π network impedance conversion circuit is explained.

Figure 5:
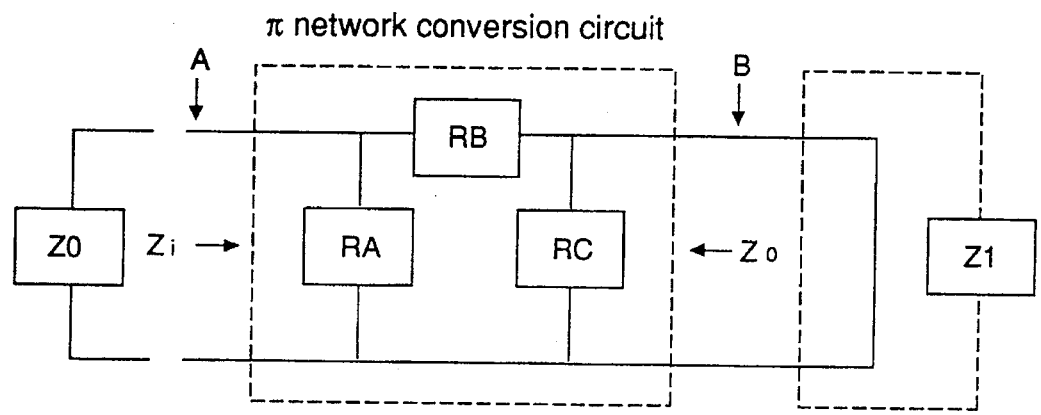
FIG. 5 is an illustration for explaining the π network impedance conversion circuit by the present invention.

FIG. 5 is an illustration for explaining the π network impedance conversion circuit.

Where, RA, RB and R3 are resistors, Z0 is the impedance of the connector 7, Z1 is the characteristic impedance of the signal electrode 6, Zi is the impedance of right side of C and Zo is the impedance of left side of D.

In the π network conversion circuit shown in FIG. 5, the impedance matching condition that matches the characteristic impedance of the signal electrode 6 with the impedance of the connector 7 is Z0=Zi and Zo=Z1.

However, it is difficult to calculate the resistance values of RA, RB, and RC in the π network conversion circuit, so that the resistance values of R1, R2 and R3 in the T network conversion circuit are calculated first, then resistance values RA, RB and RC are calculated using the T→π conversion equation.

The T→π conversion equation is as below.

RA=R/R3
RB=R/R2
RC=R/R1

Where, R=R1*R2+R2*R3+R3*R1.

Substituting the resistance values of the above-mentioned resistors R1, R2 and R3 to the above-mentioned T→π conversion equation, the resistance values of resistors RA, RB and RC are calculated as below.

Resistor RA=224Ω
Resistor RB=33Ω
Resistor RA=112Ω

Figure 6:
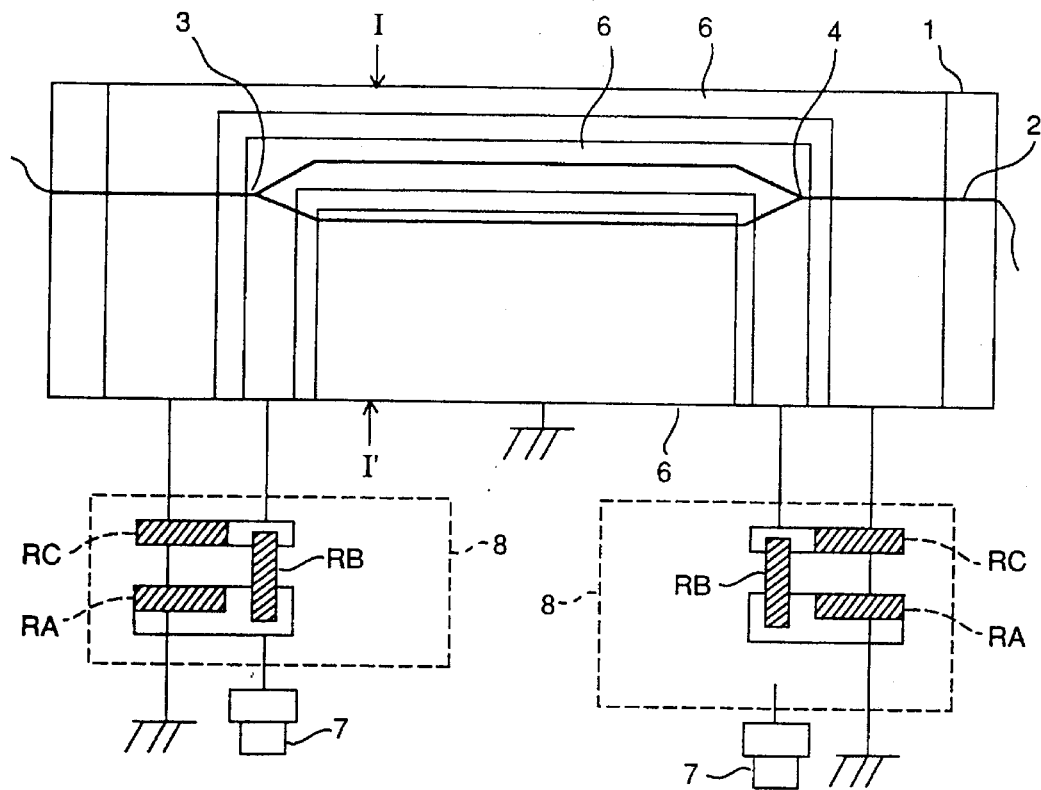
FIG. 6 is an illustration showing a configuration of a waveguide-type device provided with a π network impedance conversion circuit by the present invention.

As shown in FIG. 6, the impedance conversion circuit 8 is produced by soldering the resistors thus calculated on the electrode pad.

It is to be noted that the actual resistance values of resistors RA, RB and RC are as below, because standardized resistors are used for production.

Resistor RA=220Ω
Resistor RB=33Ω
Resistor RA=120Ω

Even in this case, impedance matching is possible because Zo=50.6Ω, Zi=44.4Ω.

Figure 7:
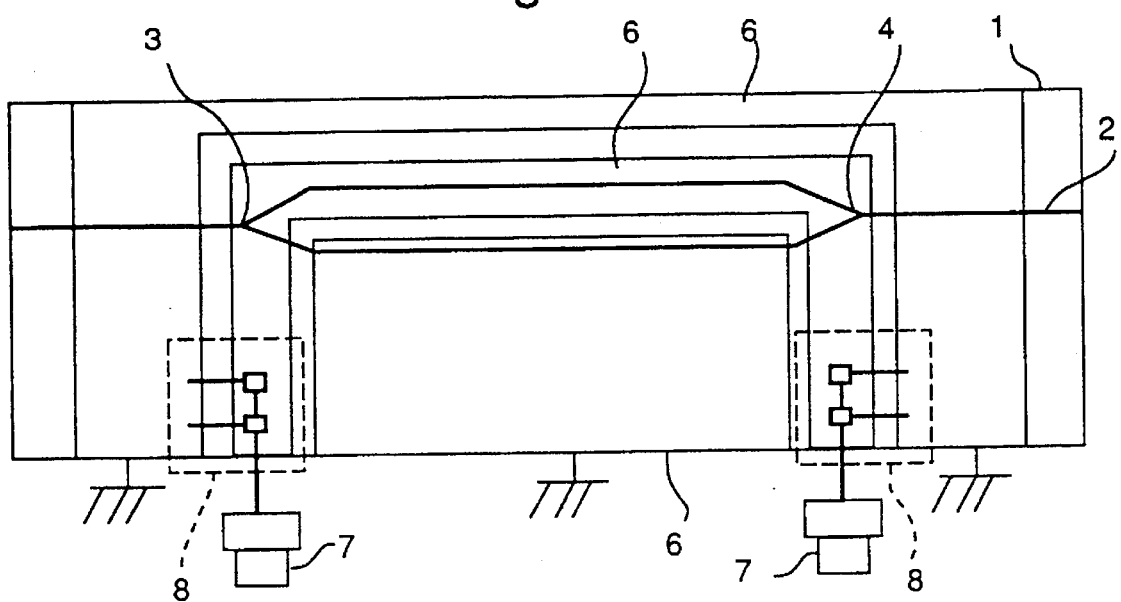
FIG. 7 is an illustration showing a configuration of a waveguide-type device provided with a π network impedance conversion circuit by the present invention.
Figure 8:
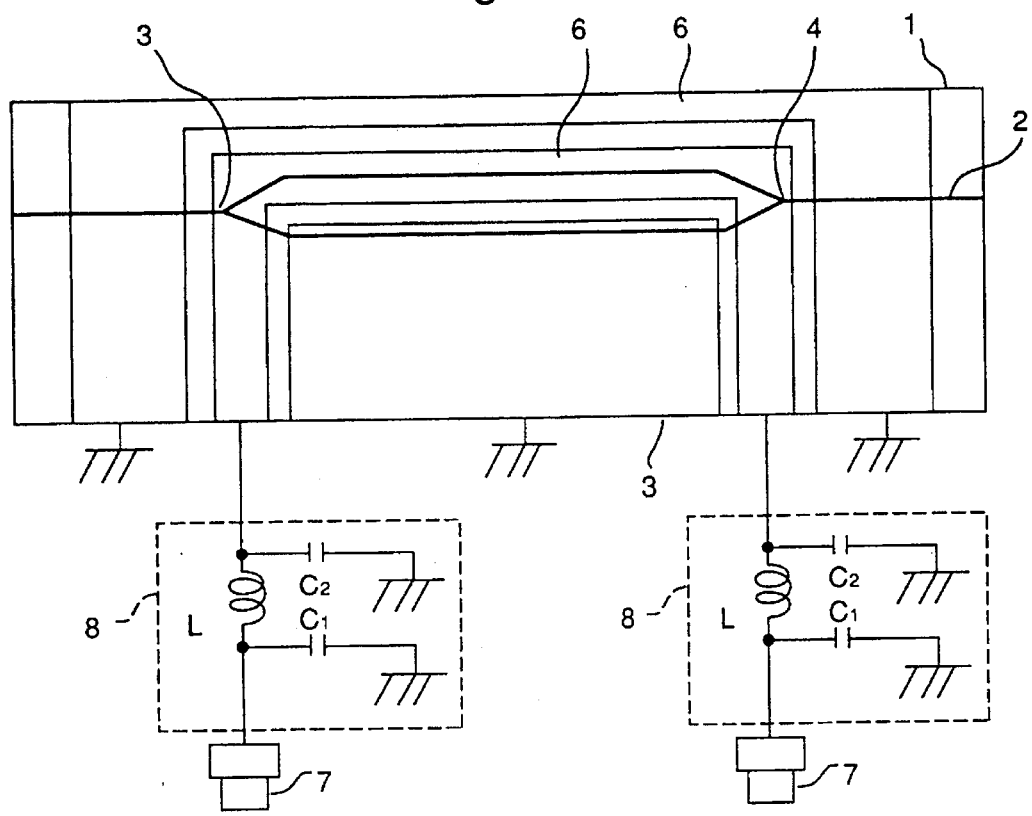
FIG. 8 is an illustration for explaining other embodiment by the present invention.
Figure 9:
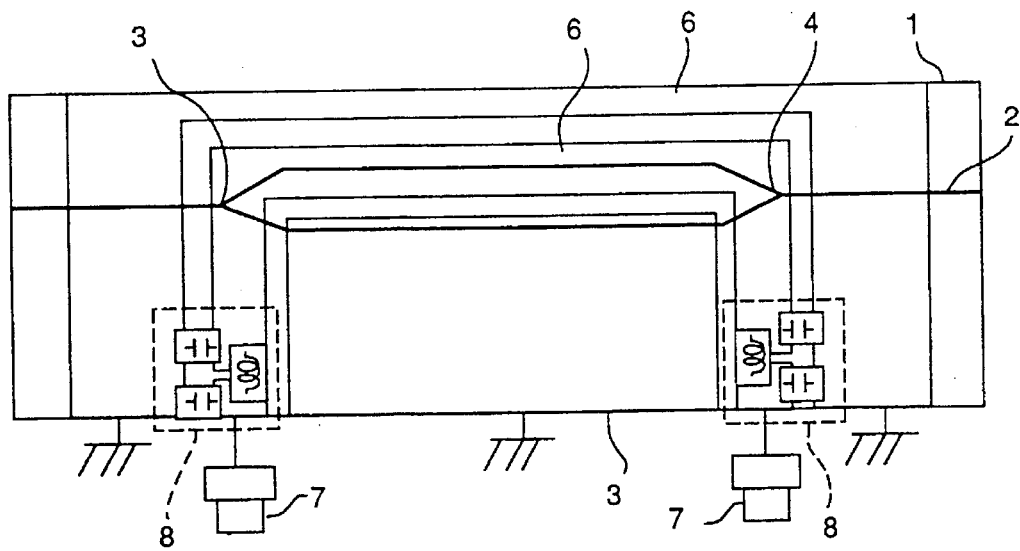
FIG. 9 is an illustration for explaining another embodiment by the present invention.
Figure 10:
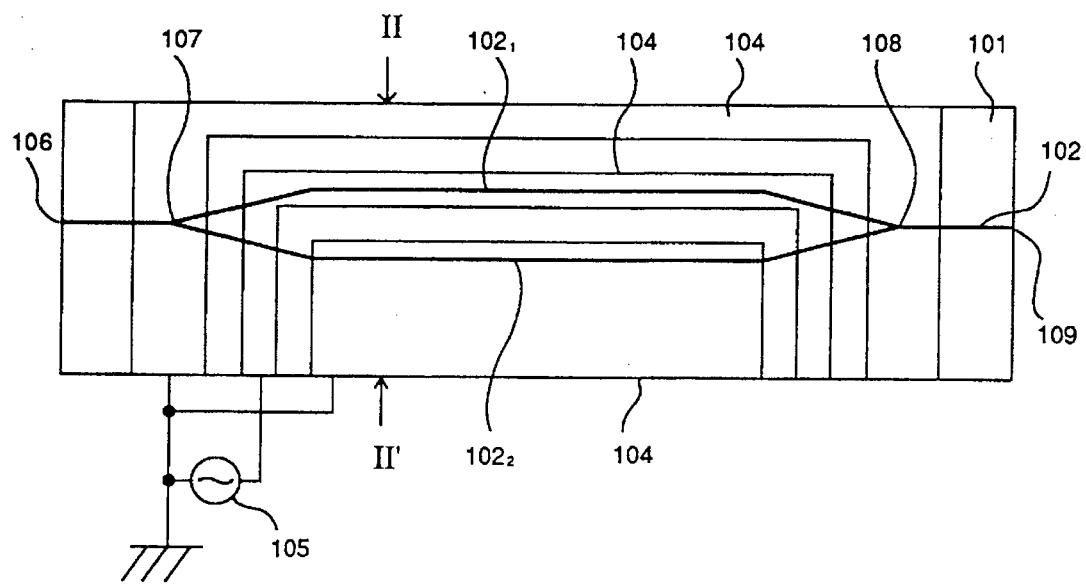
FIG. 10 is an illustration for explanation showing a configuration of a Mach-Zehnder light modulator of prior art.
Figure 11:
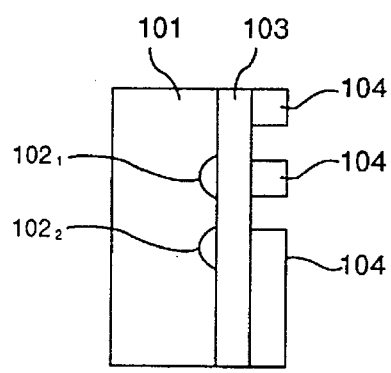
FIG. 11 is a cross section view taken on line II—II' of FIG. 10.
Figure 12:
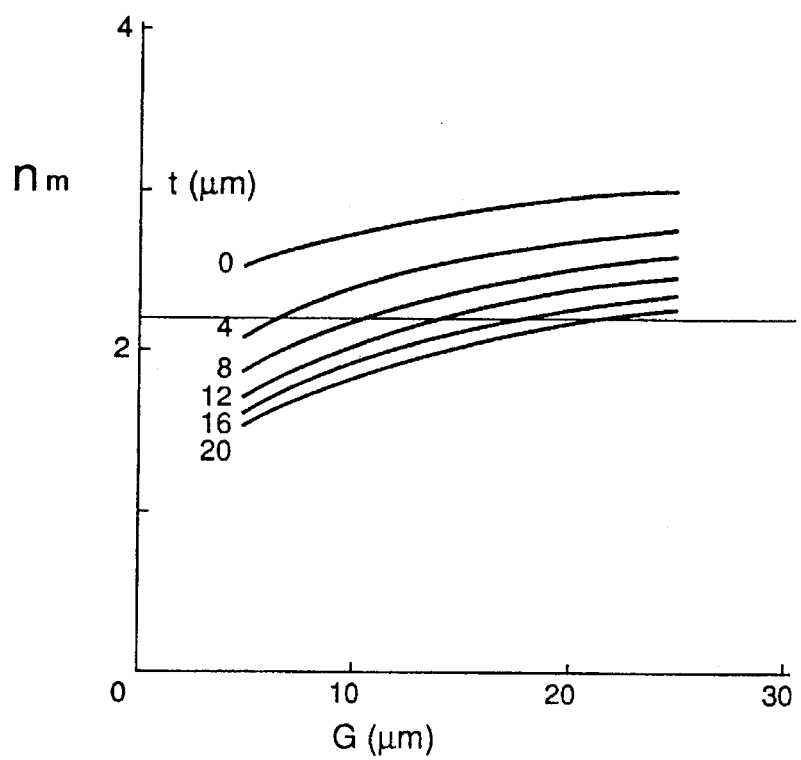
FIG. 12 is a characteristic figure showing a relation between the interval G between electrodes and the transmission refractive index $n_m$ of the waveguide-type optical device.
Figure 13:
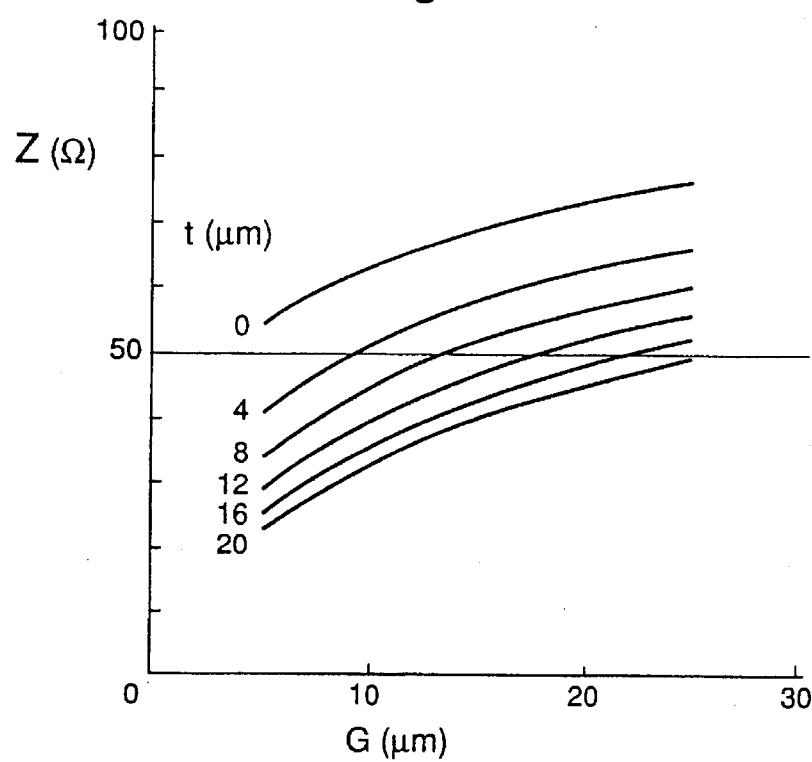
FIG. 13 is a characteristic figure showing a relation between the interval G between electrodes and the characteristic impedance Z of the waveguide-type optical device.

It is also possible to realize the above resistance values calculated using an electrode pattern as shown in FIG. 7.

At this time, if considering an electrode of which Cr is 200 Å, Pt is 200 Å, Au is 2000 Å and the width of electrode is 12 μm, the resistance value per unit length is approximately 20Ω/mm and the values of resistors RA, RB and RC are as follows.

TABLE 2

| | Width of electrode | Length of electrode |
|---|---|---|
| Resistor RA | 3.3 μm | 3.00 mm |
| Resistor RB | 12.0 μm | 1.65 mm |
| Resistor RC | 6.0 μm | 3.00 mm |

Under these conditions, it is possible to produce the smaller device.

FIG. 3 shows analysis results of characteristics of an optical device provided with such an impedance conversion circuit 8.

In FIG. 3, analysis results of an optical device in which the signal electrode and the connector of the Mach-Zehnder light modulator produced in the embodiment are connected with directly instead of an impedance conversion circuit are shown as a conventional example.

TABLE 3

| | Light modulation band Δf | Driving voltage Vπ |
|---|---|---|
| The embodiment | 6.5 GHz | 3.0 V |
| The conventional example | 4.8 GHz | 3.6 V |

As obvious from the results, comparing with the conventional example, the optical device of the embodiment realizes the large light modulation band Δf by the small driving voltage Vπ. It is confirmed that the present invention can prevent characteristics deterioration caused by impedance un-matching.

Moreover, the impedance conversion circuit 8 is configured with resistors in the above embodiment, but it is possible to configure the impedance conversion circuit 8 with conductances $C_1$, $C_2$ and inductance L.

At this time, the values of conductances $C_1$, $C_2$ and the inductance L are 1 pF, 1 pF and 3.3 nH, respectively.

The type is free for the conductance and inductance if they have desired electric characteristics.

In the above embodiments, the case of converting the characteristic impedance of the signal electrode from 44Ω to 50Ω, but it is not limited to these values. It is possible to design any impedance conversion circuit corresponding to the impedance to be matched.

Furthermore, it is needless to say that the present invention can be applied to other various types of waveguide-type optical devices, although a Mach-Zehnder light modulator has been used as an example for explanation of the present invention in the above embodiment.

What is claimed is:

1. A waveguide-type optical device comprising:

a connector connected to a source for supplying a control signal to control light waves in an optical waveguide;

a signal electrode for receiving said control signal; and an impedance matching means coupled between said source and said electrode for matching an impedance of said connector with an impedance of said signal electrode; and said impedance matching means is an impedance conversion circuit comprising a pattern wiring of resistors formed on a base of the waveguide-type optical device.

2. The waveguide-type optical device of claim 1, wherein the type of said pattern wiring is T network.

3. The waveguide-type optical device of claim 1, wherein the type of said pattern wiring is π network.

4. A waveguide-type optical device comprising:

a base;

an optical waveguide formed on said base;

a buffer layer formed on said optical waveguide;

a signal electrode formed on said buffer layer;

a connector for supplying a control signal for controlling light waves propagating in said optical waveguide to said signal electrode; and an impedance matching means coupled between said connector and said electrode for matching an impedance of said connector and an impedance of said signal electrode, wherein said impedance matching means is an impedance conversion circuit comprising resistors connected in T network.

5. A waveguide-type optical device comprising:

a base;

an optical waveguide formed on said base;

a buffer layer formed on said optical waveguide;

a signal electrode formed on said buffer layer;

a connector for supplying a control signal for controlling light waves propagating in said optical waveguide to said signal electrode; and an impedance matching means coupled between said connector and said electrode for matching an impedance of said connector and an impedance of said signal electrode, wherein said impedance matching means is an impedance conversion circuit comprising resistors connected in $\pi$ network.

6. A waveguide-type optical device comprising:

a base;

an optical waveguide formed on said base;

a buffer layer formed on said optical waveguide;

a signal electrode formed on said buffer layer;

a connector for supplying a control signal for controlling light waves propagating in said optical waveguide to said signal electrode; and an impedance matching means formed on said base and between said connector and said electrode, for matching an impedance of said connector and an impedance of said signal electrode, said impedance matching means being an impedance conversion circuit formed by configuring resistor patterns in a T network on said base.

7. A waveguide-type optical device comprising:

a base;

an optical waveguide formed on said base;

a buffer layer formed on said optical waveguide;

a signal electrode formed on said buffer layer;

a connector for supplying a control signal for controlling light waves propagating in said optical waveguide to said signal electrode; and an impedance matching means formed on said base and between said connector and said electrode, for matching an impedance of said connector and an impedance of said signal electrode, said impedance matching means being an impedance conversion circuit formed by configuring resistor patterns in a $\pi$ network on said base.

8. A waveguide-type optical device comprising a control signal source for supplying a control signal in order to control a propagation of light waves in an optical waveguide of said waveguide-type optical device, a signal electrode for receiving said control signal, and impedance matching means comprising resistors connected in a T-network for matching an impedance at a side of said control signal source to an impedance at a side of said signal electrode, said impedance matching means being provided between said side of the control signal source and said side of the signal electrode, and further being formed on a base of said waveguide-type optical device.

9. A waveguide-type optical device comprising a control signal source for supplying a control signal in order to control a propagation of light waves in an optical waveguide of said waveguide-type optical device, a signal electrode for receiving said control signal, and impedance matching means comprising resistors connected in a $\pi$-network for matching an impedance at a side of said control signal source to an impedance at a side of said signal electrode, said impedance matching means being provided between said side of the control signal source and said side of the signal electrode, and further being formed on a base of said waveguide-type optical device.

* * * * *